(12) United States Patent
Lendi

(10) Patent No.: US 10,074,976 B2
(45) Date of Patent: Sep. 11, 2018

(54) POWER DISTRIBUTOR FOR DEFINED SEQUENTIAL POWER DISTRIBUTION

(71) Applicant: Oerlikon Surface Solutions AG, Trubbach, Trubbach (CH)

(72) Inventor: Daniel Lendi, Grabs (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 591 days.

(21) Appl. No.: 14/439,815

(22) PCT Filed: Oct. 29, 2013

(86) PCT No.: PCT/EP2013/003251
§ 371 (c)(1),
(2) Date: Jul. 20, 2015

(87) PCT Pub. No.: WO2014/067650
PCT Pub. Date: May 8, 2014

(65) Prior Publication Data
US 2016/0043546 A1    Feb. 11, 2016

(30) Foreign Application Priority Data

Nov. 1, 2012    (DE) .................. 10 2012 021 346

(51) Int. Cl.
| | |
|---|---|
| H02J 1/10 | (2006.01) |
| H02J 3/38 | (2006.01) |
| H02J 7/34 | (2006.01) |
| H02J 1/00 | (2006.01) |
| H01J 37/34 | (2006.01) |
| C23C 14/34 | (2006.01) |
| C23C 14/35 | (2006.01) |

(52) U.S. Cl.
CPC ............ *H02J 1/00* (2013.01); *C23C 14/3464* (2013.01); *C23C 14/3485* (2013.01); *C23C 14/35* (2013.01); *H01J 37/3444* (2013.01); *H01J 37/3467* (2013.01)

(58) Field of Classification Search
CPC ........ H02J 1/00; C23C 14/3464; C23C 14/35; C23C 14/3485; H01J 37/3467; H01J 37/3444
USPC .......................................................... 307/18
See application file for complete search history.

(56) References Cited

U.S. PATENT DOCUMENTS

| | | | |
|---|---|---|---|
| 6,005,218 A * | 12/1999 | Walde | ............... H01J 37/32018 219/121.52 |
| 2004/0262156 A1 | 12/2004 | Seymour | |
| 2013/0276984 A1 | 10/2013 | Papa | |

FOREIGN PATENT DOCUMENTS

| | | |
|---|---|---|
| DE | 10 2006 017 382 A1 | 5/2007 |
| DE | 20 2010 001 497 U1 | 4/2010 |

(Continued)

OTHER PUBLICATIONS

International Search Report for PCT/EP2013/003251 dated Jan. 29, 2014.
Japanese Office action for 2015-540067 dated Jul. 31, 2017.

*Primary Examiner* — Richard Tan
(74) *Attorney, Agent, or Firm* — Pearne & Gordon LLP

(57) ABSTRACT

A power distributor that is capable of distributing the high power from a DC generator to more than two targets sequentially and without the power output of the DC generator being interrupted. Furthermore, the invention relates to a sputter source that includes the power generator described above.

8 Claims, 4 Drawing Sheets

(56) References Cited

FOREIGN PATENT DOCUMENTS

| | | |
|---|---|---|
| EP | 2 325 349 A1 | 5/2011 |
| JP | 08-311647 A | 11/1996 |
| JP | 2002-091576 A | 3/2002 |
| JP | 2003-129234 A | 5/2003 |
| JP | 2009-232542 A | 10/2009 |
| JP | 2010-065240 A | 3/2010 |
| WO | 2007/054048 A1 | 5/2007 |
| WO | 2010/001723 A1 | 1/2010 |

* cited by examiner

POWER DISTRIBUTOR FOR DEFINED SEQUENTIAL POWER DISTRIBUTION

The present invention is directed to a switch, which allows to sequentially distribute the DC power provided by a DC generator to more than two loads without that the power delivery of the generator has to be interrupted.

Power generators are used in different applications. One application area of power generators is the so-called magnetron sputtering. This is a PVD coating method by which and with the help of a magnetron, material is sputtered from a target by means of ion impact. The sputtered material may then deposit on a substrate to be coated. A drawback of this conventional sputtering technology is the low ionization degree of the sputtered material. The higher namely that the ionization degree is the more effective a substrate bias may be exploited to additionally accelerate the sputtered material towards the substrate. It is only at very high current densities that a predominant ionization of the sputtered material arises in sputtering. Necessary condition to achieve a high current density is nevertheless the supply of a high power, which nevertheless leads to a strong thermal loading of the target. This is the reason for which in the so-called HIPIMS-method the power is applied pulse-wise to the target. For these high powers, it is nevertheless technically difficult to realize respective pulse-generators.

According to a new method, the power necessitated at the target is not anymore provided by a pulse-generator but by a DC generator with substantially constant power delivery. According to this method, more than two targets are subsequently supplied with the power of the DC generator. Principally this may be realized by simply switching over from one target to the next one. Nevertheless, it has shown up in praxis that this simple switch-over is heavily loading the targets so that already after too frequent operating hours, target breakdowns occurs. It is suspected that this is due, inter alia to power peaks caused by the switching over.

Therefore, it would be desirable to provide a switching possibility, which allows distributing the high power delivery of the DC generator reliably and without excessive loading of the targets, sequentially to different targets in a manner that the power delivered from the DC generator is substantially constant.

This accords to the object of the present invention.

According to the invention, the object is resolved by a power distributor according to claim 1. It has become apparent that with the power distributor according thereto the power may reliably and especially mildly be sequentially distributed to the different targets.

The invention is now explained in details by means of an example and with the help of the figures.

Figure 1:
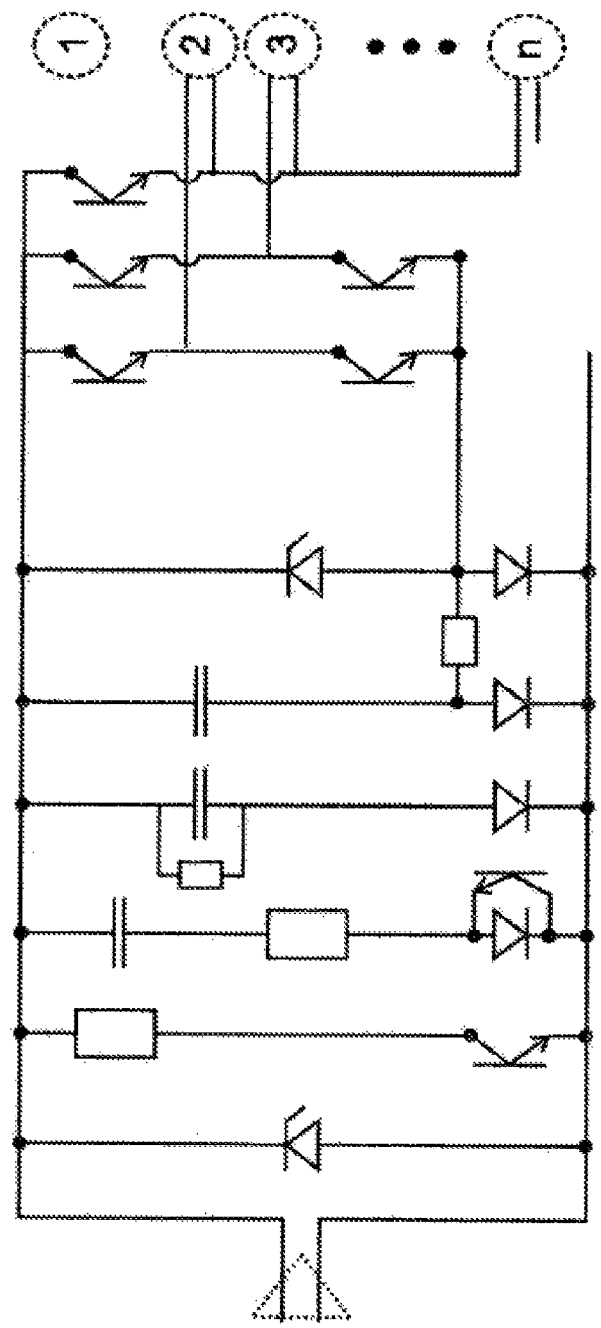
FIG. 1 shows a generic circuitry schema of a power distributor according to one embodiment of the present invention.
Figure 2:
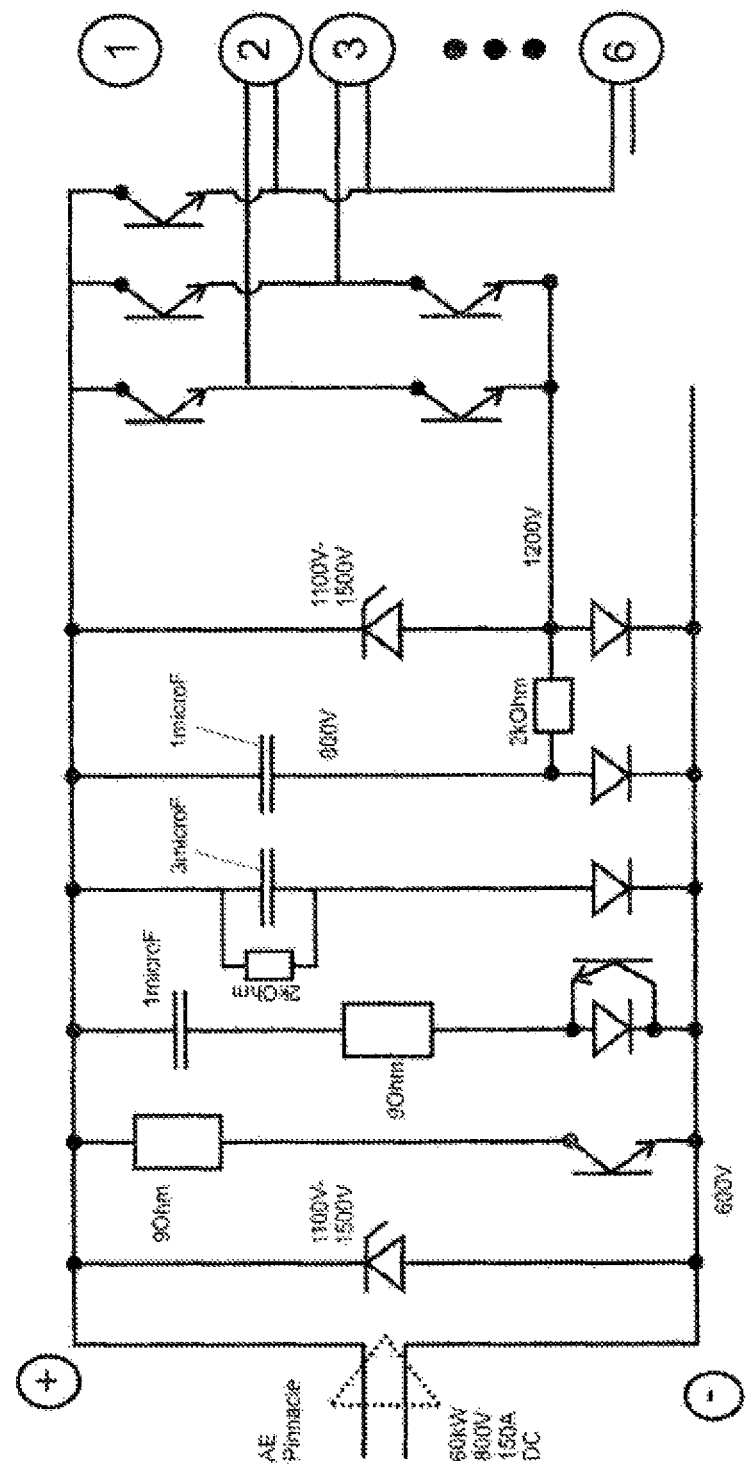
FIG. 2 shows the circuitry schema of a power distributor according to the invention, which can distribute the power on 6 targets.

In the example of FIG. 2, an AE Pinnacle® is used as a DC generator, which may deliver a DC power of 60 kW. At most, 800 V may be set. At most, 150 A may flow. The power generator according to FIG. 2 is connected to the outputs of the DC generator. To the outputs of the power generator respectively separated six targets are connected. The symbols shown in FIG. 2 are known to the skilled artisan and thus no additional explanations are necessary. This power distributor allows, in a simple manner, first to apply the full power of the DC generator to the first target and, after a predetermined first time interval, to switch it to the second target and, after a predetermined second time interval, to the third target, etc. up to applying the power on the sixth target. Especially preferred is the fact that it becomes possible by means of the power distributor according to the invention to re-initiate supplying the first target after having supplied the sixth target and thus to re-initiate a new switching cycle. The respective procedure may be repeated several times.

Most DC generators do not deliver the full power instantaneously after start up. There results a power build-up interval. By means of the power distributor according to the invention, the power may be delivered during the power build-up interval to a power sink. Such a power sink may e.g. be a simple ohmic resistance. After a switching cycle, i.e. after supplying the last target, the power needs not to be first led to the power sink but one may directly re-supply the first target with power.

The power distributor according to the invention may further be exploited, in the case of so-called Arcing, to divert the power to the power sink until the Arcing has been suppressed. Also in this case, the power delivery by the DC generator is not interrupted and a further power build-up interval needs to arise.

Figure 3:
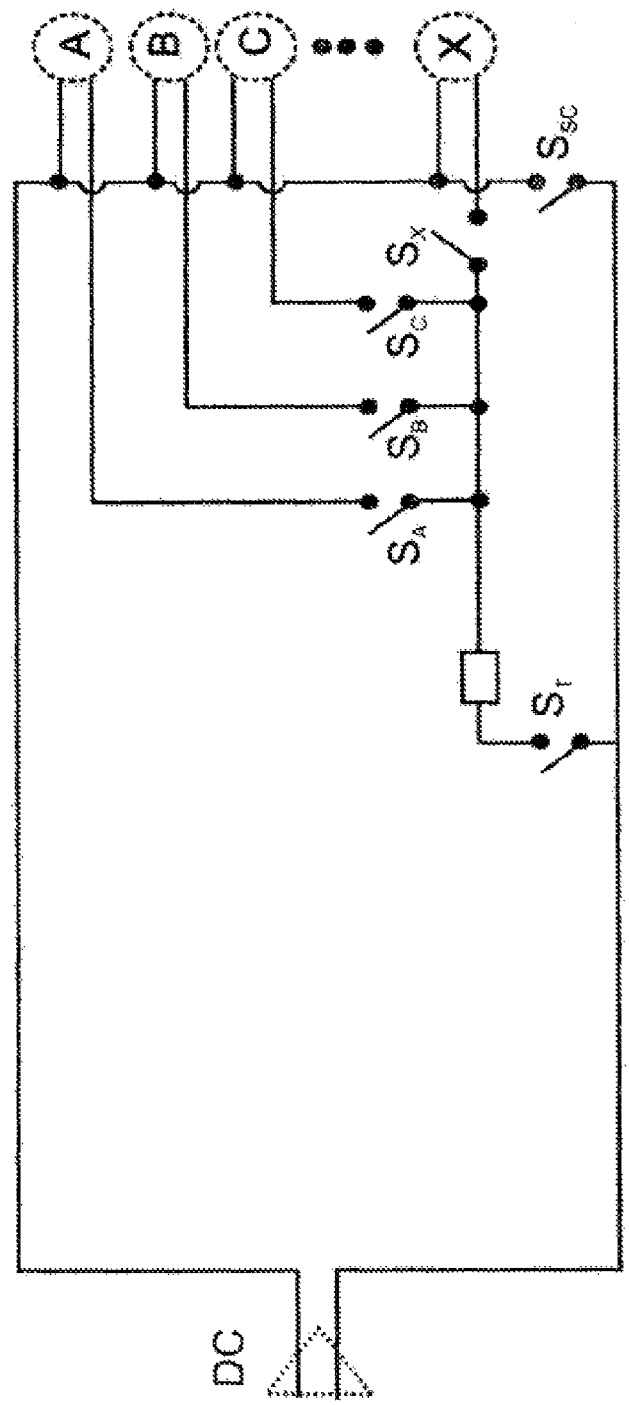
FIG. 3 shows the circuitry schema of a power distributor according to the invention and according to a simple form of realization.

FIG. 3 shows the schema of a first embodiment of the present invention. Thereby, the DC generator DC is shown by a triangle in dotted lines. In the example, the positive output of the DC generator DC is in direct contact with all targets A to X by means of a respective connection. The negative output of the DC generator is as well electrically connected to all targets via a switch $S_T$ downstream of which an ohmic resistance $R_T$ being provided. Nevertheless, the connection to target A may be interrupted by means of a switch $S_A$. The connection to target B may be interrupted by means of switch $S_B$. Respective switches $S_C$ to $S_X$ are provided for the further targets.

In use switch ST is closed. Subsequently there is additionally e.g. $S_A$ closed. Thus, the voltage of the DC generator DC is applied to target A. There results power a delivery. E.g. there may be ignited upon target A a plasma so that a sputtering process occurs at target A. Due to the power delivery to target A, the target is heated up very rapidly. Before the target A becomes too hot, e.g. target B may be connected by means of switch $S_B$. If simultaneously or, as preferred, shortly subsequently, the switch $S_A$ is opened, the plasma migrates from target A to target B and full power delivery occurs to target B. Before target B heats up too much, target C may be operationally added by means of switch $S_C$ and target B switched off by means of switch $S_B$. In analogy, one proceeds with the remaining targets up to the last target X. Before target X heats up is too much, switch $S_A$ is again closed and simultaneously or, preferably, shorty subsequently, switch $S_X$ opened. Thus a new switching cycle is started. As many switching cycles as desired may be performed one after the other. The targets are thus periodically and for a short time loaded with power and have, during the other targets being subsequently loaded with power, a longer cool-down time. The power delivery by the DC generator DC remains there while substantially constant. If the time for cooling down should not suffice to cool down a target to a desired temperature, after one or more than one switching cycle the power delivery may e.g. by means of switch $S_T$ be completely interrupted.

In the FIG. 3 there is additionally shown a switch $S_{SC}$. If this switch is closed, there is established a short circuit between the two outputs of the DC generator DC. Such DC generators DC have for the case of short-circuiting customarily a respective safeguarding, which is respectively activated and leads to shut down. Switch $S_{SC}$ is respectively provided for the case of a failure. Thereby, a rapid shut down is possible.

Preferably, some and, especially preferred, all switches are realized as bi-polar transistors with isolated gate electrodes (IGBT). This is shown in FIG. 4.

Figure 4:
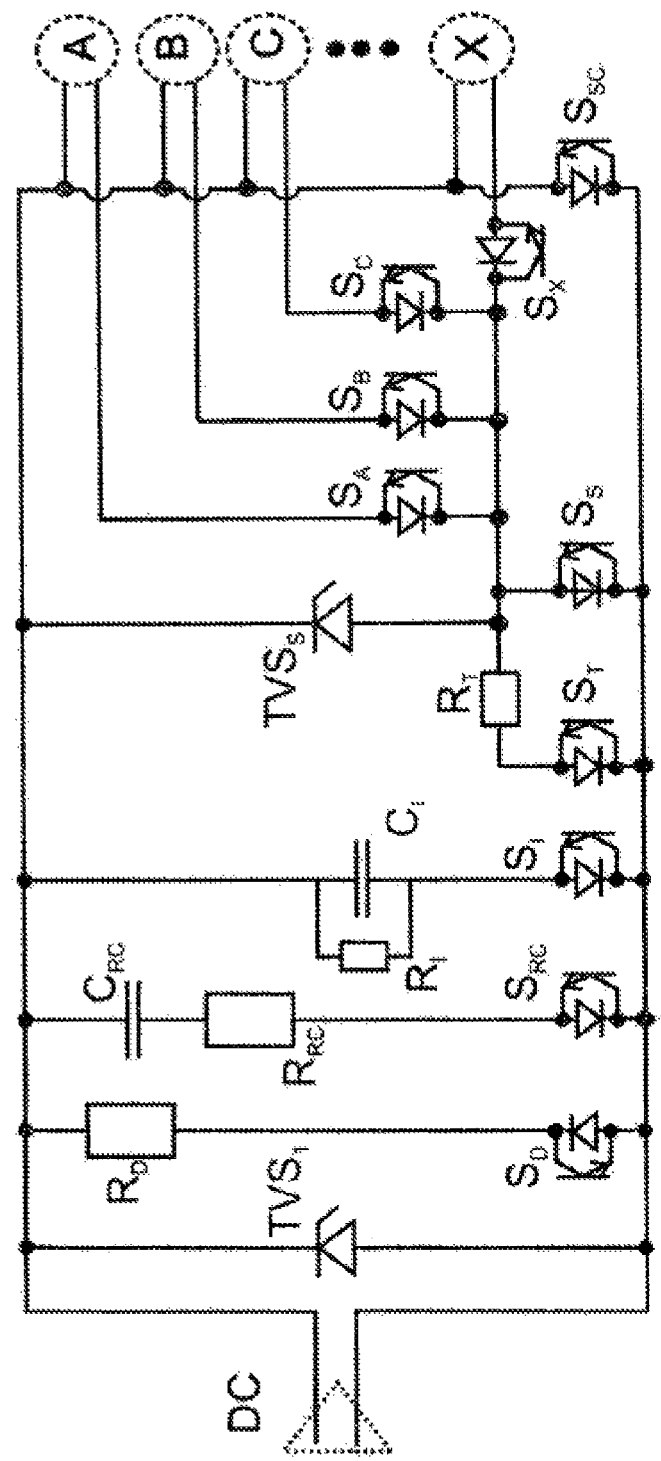
FIG. 4 shows the circuitry schema of a power distributor according to the invention and according to a further embodiment.

Additionally, there is shown in FIG. 4 a protective diode $TVS_1$, which is directly connected to the outputs of the DC generator DC. Thereby, the other construction elements are protected from too high voltage peaks.

There is additionally shown in FIG. 4 an ohmic resistance $R_D$ that is connected to the outputs of the DC generator via a switch $S_D$. If the switch is realized by an IGBT one should pay attention to the polarity of the diode, which is not equal to the polarity of the diodes of the other switches. This so-called dummyload fulfills the two functions as already addressed above of the power sink. Thereby, the resistance $R_D$ may be realized by different e.g. parallel-connected ohmic resistances.

There is additionally shown in FIG. 4 the circuit of a RC element, whereby an ohmic resistance $R_{RC}$, a capacitor $C_{RC}$ and switch $S_{RC}$ are connected in series. This RC element is connected to the outputs of the DC generator DC and allow smoothening power variations. Here too, resistance $R_{RC}$ and/or capacitor $C_{RC}$ may be realized by means of more than one distinct elements.

Further, there is shown in FIG. 4 an ignition support circuitry which comprises a switch $S_I$, a resistance $R_I$ and a capacitor $C_I$, whereby the resistance $R_I$ and the capacitor $C_I$ are mutually connected in parallel. This part of the circuitry allows short-time generation of very high voltages so that a plasma may be ignited.

There is further shown in FIG. 4 a further protective diode $TSV_S$ which is, on one side, directly connected to the positive output of the DC generator DC and, on the other side, contacts the connection of resistance $R_T$ and the target switches $S_A$ to $S_X$. This contact may be connected to the negative output of the DC generator as shown in FIG. 4, via a switch $S_S$.

Examples of values of the resistances and capacitors:

$R_D$: 9 Ohm
$R_{RC}$: 9 Ohm
$R_I$: 2 kOhm
$R_T$: 2 kOhm
$C_{RC}$: 1 µF
$C_I$: 3 µF

Once again, the following points shall be addressed of which one, more than one or all may be realized so as to achieve the invention:

a) There was described a power distributor suited for distributing the substantially constant power of a DC generator sequentially and without interruption of power delivery to more than two targets A, B, C, . . . , X which is characterized by the facts that the power distributor comprises a circuitry, which connects an output of the DC generator to all of the more than two targets A, B, C, . . . , X and wherein the other output of the DC generators, subsequent to an ohmic resistance RT, branches according to the number of the targets and each target A, B, C, . . . , X is connected to one of the branches, whereby the branches each comprise a switch SA, SB, SC, . . . , SX respectively assigned to one target, by which a line to the assigned target may be interrupted.

b) The power distributor as addressed under a) may comprise between the other output of the DC generator and the ohmic resistance RT a switch ST.

c) The power distributor as addressed in a) or b) may have a direct connection between the one output and the other output of the DC generator, interrupted by means of a switch SSC.

d) The power distributor as addressed in a), b) or c) may comprise an ohmic resistance $R_D$, which, whenever the DC generator is connected, is connected to the outputs of the DC generator, via a switch $S_D$.

e) The power distributor as addressed in a), b), c) or d) may provide for a circuitry of an RC element, which, whenever, the DC generator is connected, is connected to the outputs of the DC generator, via a switch $S_{RC}$.

f) The power distributor as addressed in a), b), c), d) or e) may provide for a circuitry for supporting ignition, which comprises a switch $S_I$, a resistance $R_I$ and a capacitor $C_I$, whereby the resistance $R_I$ and the capacitor $C_I$ are mutually connected in parallel and wherein the circuitry for supporting ignition, whenever the DC generator is connected, is connected to the outputs of the DC generator.

g) The power distributor as addressed in a), b), c), d), e) or f) may provide for a protective diode TVS1, which is connected to the outputs of the DC generator, whenever the DC generator is connected.

h) At the power distributor as addressed in a), b), c), d), e), f), or g) at least one of the switches, preferably more than one of the switches and especially preferred all switches are realized as IGBT.

h) The power distributor as addressed in a), b), c), d), e), f), g) or h) may be part of a coating apparatus, which comprises a DC generator and more than one target realized as sputtering cathode, whereby the targets are connectable to the DC generator via the power distributor.

The invention claimed is:

1. A power distributor suited for distributing a power of a DC generator sequentially and without interruption of power delivery to more than two targets of a coating apparatus, comprising:
    circuitry including:
        a first ohmic resistance; and
        a plurality of first switches, each one of the first switches corresponding to a respective one of the targets,
    the circuitry being configured to connect one output of the DC generator to one end of each of the targets,
    the first ohmic resistance having one end and another end, the one end of the first ohmic resistance being configured to connect to another output of the DC generator, the another end of the first ohmic resistance being connected to the first switches,
    each of the first switches being configured to connect to another end of the respective one of the targets, and
    the first switches being configured to distribute the power to one of the targets selectively,
    wherein
        the circuitry further includes a second ohmic resistance and a second switch,
        the second ohmic resistance being configured to connect to the one output and the another output of the DC generator via the second switch.

2. The power distributor according to claim 1, wherein the circuitry further includes a third switch, wherein the third switch is connected to the one end of the first ohmic resistance, and is configured to connect to the another output of the DC generator.

3. The power distributor according to claim 2, wherein the circuitry further includes a fourth switch, wherein the fourth switch is configured to connect between the one output and the another output of the DC generator.

4. The power distributor according to claim 3, wherein the circuitry further includes an RC element and a fifth switch,
the RC element is configured to connect to the one output and the another output of the DC generator via the fifth switch, and
the RC element includes a third ohmic resistance and a first capacitor, the first capacitor is connected to the third ohmic resistance in series.

5. The power distributor according to claim 4, wherein the circuitry further includes a fourth ohmic resistance, a second capacitor, and a sixth switch,
the fourth ohmic resistance and the second capacitor are mutually connected in parallel, and
the fourth ohmic resistance and the second capacitor are configured to connect to the one output and the another output of the DC generator via the sixth switch.

6. The power distributor according to claim 5, wherein the circuitry further includes a protective diode, and
the protective diode is configured to connect between the one output and the another output of the DC generator.

7. The power distributor according to claim 6, wherein at least one of the first switches is constituted of IGBT.

8. A coating apparatus comprising:
the DC generator;
the more than two targets as sputtering cathodes; and
the power distributor according to claim 1,
wherein the targets are connectable to the DC generator via the power distributor.

* * * * *